(12) United States Patent
Okayasu

(10) Patent No.: US 8,301,411 B2
(45) Date of Patent: Oct. 30, 2012

(54) ELECTRONIC DEVICE, HOST APPARATUS, COMMUNICATION SYSTEM, AND RECORDING MEDIUM

(75) Inventor: Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 424 days.

(21) Appl. No.: 12/687,090

(22) Filed: Jan. 13, 2010

(65) Prior Publication Data
US 2010/0161280 A1 Jun. 24, 2010

Related U.S. Application Data

(63) Continuation-in-part of application No. PCT/JP2007/064080, filed on Jul. 17, 2007.

(51) Int. Cl.
*G06F 19/00* (2011.01)
(52) U.S. Cl. ...................................... 702/179
(58) Field of Classification Search .................. 702/183, 702/182, 184, 185, 130, 188
See application file for complete search history.

(56) References Cited

U.S. PATENT DOCUMENTS

| | | | |
|---|---|---|---|
| 6,154,857 A | 11/2000 | Mann | |
| 2009/0006808 A1* | 1/2009 | Blumrich et al. | 712/12 |

FOREIGN PATENT DOCUMENTS

| | | |
|---|---|---|
| DE | 698 01 156 T2 | 3/2002 |
| JP | 5-2502 A | 1/1993 |
| JP | 9-297694 A | 11/1997 |
| JP | 11-184726 A | 7/1999 |
| JP | 2000-99484 A | 4/2000 |
| JP | 2003-345628 A | 12/2003 |
| JP | 2006-3216 A | 1/2006 |
| KR | 10-2005-0037537 A | 4/2005 |

OTHER PUBLICATIONS

"IEEE Standard Test Access Port and Boundary-Scan Architecture", IEEE Std 1149.1-2001 Downloaded on Jul. 21, 2010 at 08:48:38 UTC from IEEE Xplore.
German Office Action dated on Oct. 8, 2010, in a counterpart application DE 11 2007 003 597.8-53.
International Search Report (ISR) issued in PCT/JP2007/064080 (patent application) for Examiner consideration.
Written Opinion (PCT/ISA/237) issued in PCT/JP2007/064080 (patent application).
Korean Office Action dated Feb. 2, 2012, in a counterpart Korean patent application 10-2010-7002205. (This Korean OA cites Foreign Patent document JP H09-297694).
Korean Office Action dated Jun. 13, 2012, in a counterpart Korean patent application 10-2012-7008541. (This Korean OA cites Foreign Patent document No. 1 and JP H11-184726).
Japanese Office Action dated Aug. 28, 2012, in a counterpart Japanese patent application No. 2009-523468.

* cited by examiner

*Primary Examiner* — Edward Raymond
(74) *Attorney, Agent, or Firm* — Chen Yoshimura LLP

(57) ABSTRACT

Provided is a communication system comprising a host apparatus and an electronic device that is implemented in an apparatus that communicates with the host apparatus via a network. The electronic device includes an operation circuit that operates when the electronic device is implemented; a diagnostic circuit that tests the operation circuit; and a result transmitting section that transmits a test result obtained by the diagnostic circuit to the host apparatus via the network. The host apparatus includes a test information storage section that stores in advance test information indicating test content to be performed by the diagnostic circuit; and a test information transmitting section that, when the test information is requested by the electronic device, transmits the test information to the electronic device.

28 Claims, 12 Drawing Sheets

ELECTRONIC DEVICE, HOST APPARATUS, COMMUNICATION SYSTEM, AND RECORDING MEDIUM

CROSS REFERENCE TO RELATED APPLICATION

This is a continuation in-part application of PCT/JP2007/64080 filed on Jul. 17, 2007.

BACKGROUND

1. Technical Field

The present invention relates to an electronic device, a host apparatus, a communication system, and a recording medium. In particular, the present invention relates to an electronic device implemented in an apparatus that communicates with a host apparatus via a network, a host apparatus that communicates with the apparatus via the network, a communication system that includes the apparatus and the host apparatus, and a recording medium storing thereon a program that causes a computer to function as the host apparatus.

2. Related Art

In recent years, there has been a great increase in the use of electronic devices such as semiconductor chips. For example, electronic devices are used as computing apparatuses or storage apparatuses in computers or cellular phones. As a result, electronic devices are being used in a variety of different environments.

The characteristics of a semiconductor chip decay with use. Furthermore, each individual semiconductor chip has different characteristics. Therefore, when designing a semiconductor chip, the characteristics are allowed a prescribed margin of error that takes into account characteristic decay and individual variation. When performing tests on the semiconductor chips before shipping, a judgment is made as to whether the characteristics of each semiconductor chip are within the allowable margin of error, as shown in, for example, Japanese Patent Application Publication No. 2006-3216. This testing may also include a test of the rate of decay of the semiconductor chip.

With this testing, however, the rate of decay of the semiconductor chip or the degree of variation can only be measured under constant test conditions. Therefore, it is difficult to accurately know how much the characteristics will decay or what the distribution of the decay will be when the semiconductor chip is used in a variety of different environments. Furthermore, it is difficult to accurately determine the margin of the allowable error when designing chips in the future.

SUMMARY

Therefore, it is an object of an aspect of the innovations herein to provide an electronic device, a host apparatus, a communication system, and a recording medium, which are capable of overcoming the above drawbacks accompanying the related art. The above and other objects can be achieved by combinations described in the independent claims. The dependent claims define further advantageous and exemplary combinations of the innovations herein.

According to a first aspect of the present invention, provided is an electronic device implemented in an apparatus that communicates with a host apparatus via a network, comprising an operation circuit that operates when the electronic device is implemented; a diagnostic circuit that tests the operation circuit; and a result transmitting section that transmits a test result obtained by the diagnostic circuit to the host apparatus via the network.

According to a second aspect of the present invention, provided is a host apparatus that communicates, via a network, with an apparatus in which is implemented an electronic device housing a diagnostic circuit, the host apparatus comprising a test information storage section that stores in advance test information indicating test content to be performed by the diagnostic circuit; and a test information transmitting section that, when the test information is requested by the electronic device, transmits the test information to the electronic device.

According to a third aspect of the present invention, provided is a communication system comprising a host apparatus and an electronic device that is implemented in an apparatus that communicates with the host apparatus via a network. The electronic device includes an operation circuit that operates when the electronic device is implemented; a diagnostic circuit that tests the operation circuit; and a result transmitting section that transmits a test result obtained by the diagnostic circuit to the host apparatus via the network. The host apparatus includes a test information storage section that stores in advance test information indicating test content to be performed by the diagnostic circuit; and a test information transmitting section that, when the test information is requested by the electronic device, transmits the test information to the electronic device.

According to a fourth aspect of the present invention, provided is a recording medium storing thereon a program that causes a computer to function as a host apparatus that communicates, via a network, with an apparatus in which is implemented an electronic device housing a diagnostic circuit, the program causing the computer to function as a test information storage section that stores in advance test information indicating test content to be performed by the diagnostic circuit; and a test information transmitting section that, when the test information is requested by the electronic device, transmits the test information to the electronic device.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
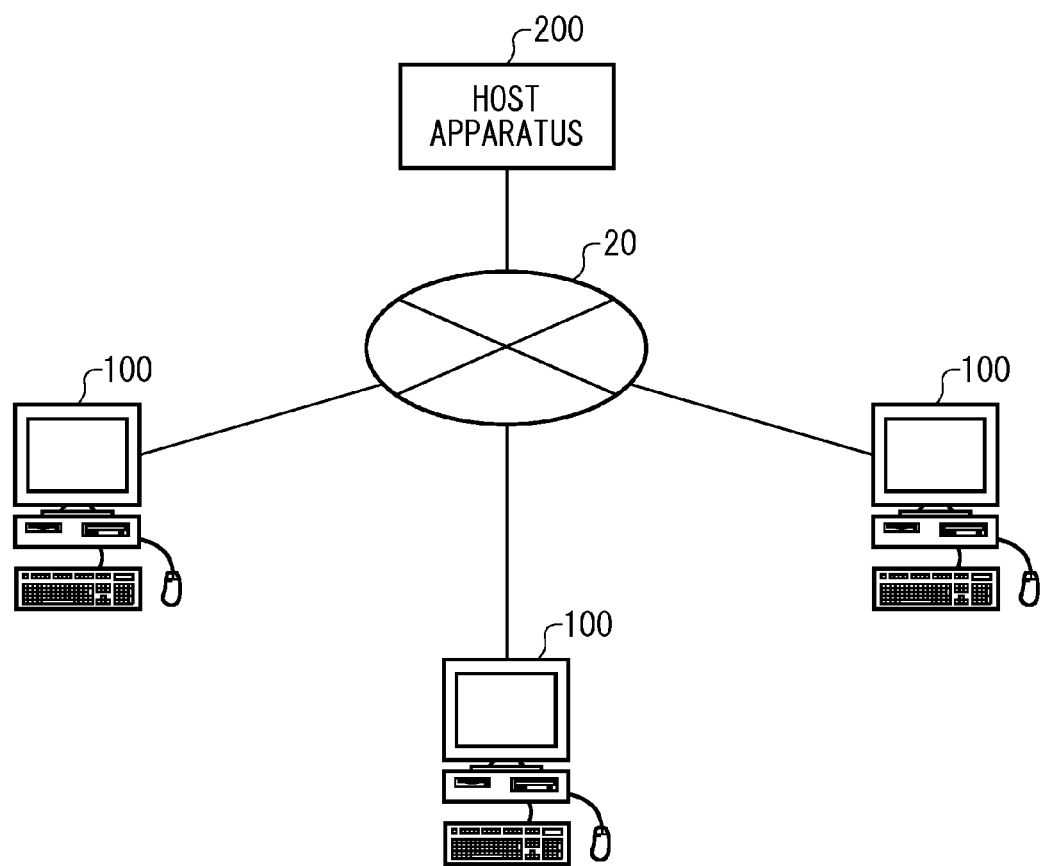
FIG. 1 shows an exemplary configuration of the communication system 10 according to an embodiment of the present invention.

FIG. 1 shows an exemplary configuration of the communication system 10 according to an embodiment of the present invention. The communication system 10 includes a host apparatus 200, a network 20, and a plurality of user apparatuses 100.

The user apparatuses 100 are capable of communicating with the host apparatus 200 via the network. Each user apparatus 100 may be a computer, for example, that communicates with the host apparatus 200 via the network 20, which may be the Internet, a phone line, or the like. As another example, the user apparatuses 100 may be cellular phones that communicate with the host apparatus 200 via a wireless communication network 20. The user apparatuses 100 may instead be some other type of apparatus that has a communication function.

The host apparatus 200 is capable of communicating with the user apparatuses 100 via the network 20. For example, the host apparatus 200 may be a server connected to the network 20. The host apparatus 200 may use a diagnostic circuit in an electronic device provided in a user apparatus 100 to test an operation circuit in the electronic device, and may receive results of this test. In this way, the host apparatus 200 can acquire information concerning characteristic decay or the like in various usage environments for each of a plurality of electronic devices.

Figure 2:
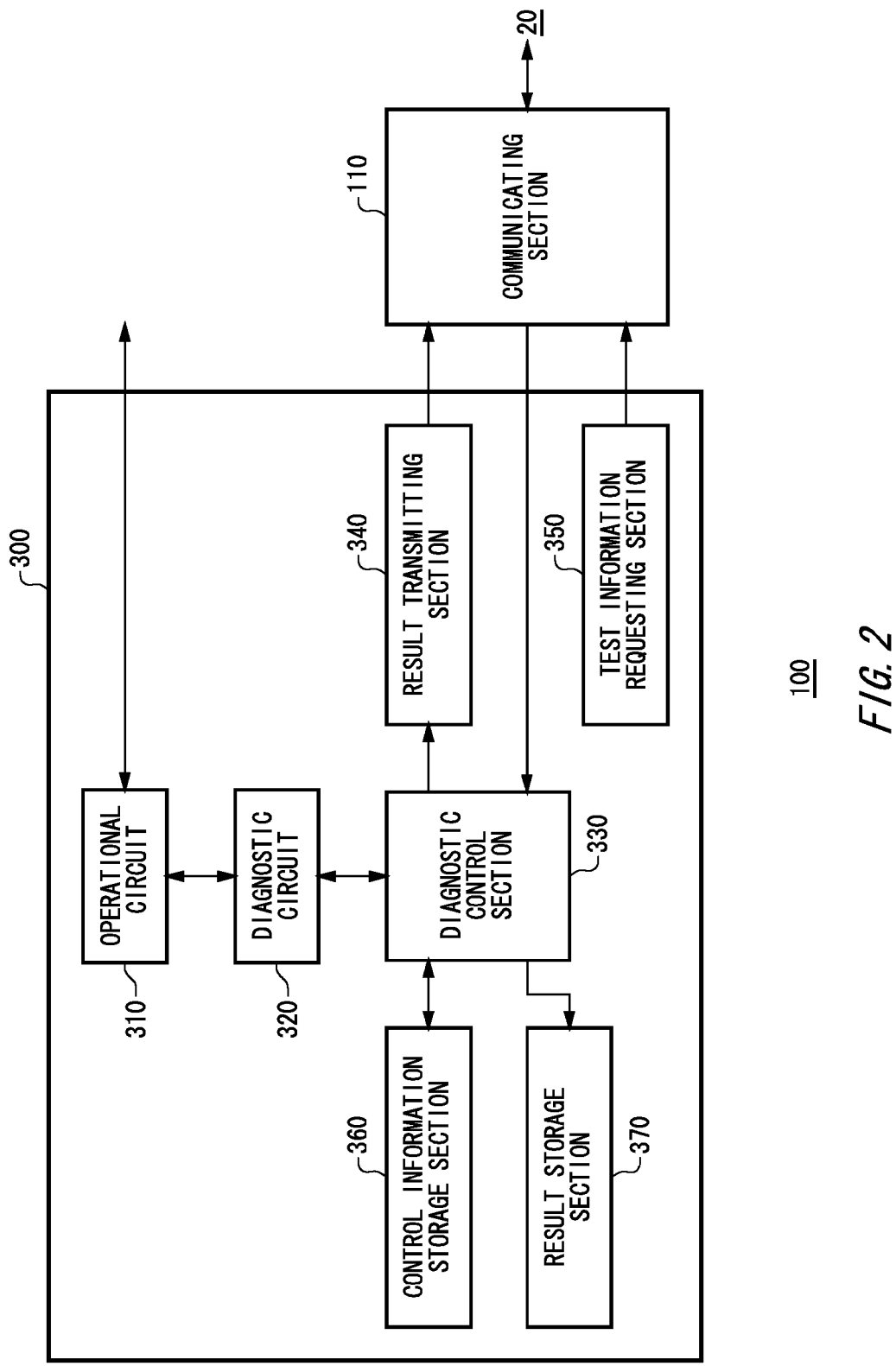
FIG. 2 shows an exemplary configuration of a user apparatus 100. The user apparatus 100 includes a communicating section 110 and an electronic device 300.

FIG. 2 shows an exemplary configuration of a user apparatus 100. The user apparatus 100 includes a communicating section 110 and an electronic device 300. The user apparatus 100 may further include other elements depending on the function and application of the user apparatus 100. For example, the user apparatus 100 may further include a display section or the like. The communicating section 110 communicates with the host apparatus 200 via the network 20. The communicating section 110 may be capable of communicating with other user apparatuses 100 via the network 20.

The electronic device 300 may realize at least a portion of the functions of the user apparatus 100. For example, the electronic device 300 may function as a computing unit in the user apparatus 100, a storage unit in the user apparatus 100, or other types of units.

The electronic device 300 includes an operation circuit 310, a diagnostic circuit 320, a diagnostic control circuit 330, a result transmitting section 340, a test information requesting section 350, a control information storage section 360, and a result storage section 370. The operation circuit 310 operates while the electronic device 300 is implemented in the user apparatus 100, and realizes at least a portion of the functions of the user apparatus 100. The operation circuit 310 may exchange data with other circuits within the user apparatus 100. The operation circuit 310 may be a computing unit, a storage unit, or the like.

The diagnostic circuit 320 tests the operation circuit 310 while the electronic device 300 is implemented in the user apparatus 100. The diagnostic circuit 320 may be a so-called BIST (Built In Self Test) circuit. For example, the diagnostic circuit 320 may test whether the operation circuit 310 is operating properly, or may measure the characteristics of the operation circuit 310. The diagnostic circuit 320 may test the operation circuit 310 when the operation circuit 310 is not operating to perform a function of the user apparatus 100. For example, the diagnostic circuit 320 may test the operation circuit 310 during start-up of the user apparatus 100, during shut-down of the user apparatus 100, or the like.

More specifically, the diagnostic circuit 320 may judge whether the operation circuit 310 is operating properly by comparing (i) a signal under test output by the operation circuit 310 when a prescribed test signal is input to the operation circuit 310 and (ii) an expected value signal corresponding to the test signal. At this time, the diagnostic circuit 320 may measure a range (margin) of a test condition for which the operation circuit 310 operates properly by changing the test condition and judging whether the operation circuit 310 is operating properly.

The test conditions used by the diagnostic circuit 320 may include characteristics of the test signal supplied to the operation circuit 310, such as frequency or timing, the signal timing of the principal signal transmission path in the operation circuit 310, a power supply voltage, frequency of a clock signal, or the like. Furthermore, the diagnostic circuit 320 may change the power supply voltage of the user apparatus 100 or the like. In this way, the diagnostic circuit 320 can measure a range (margin) of power supply voltages, test signal frequencies, and the like for which the operation circuit 310 can operate properly.

The diagnostic circuit 320 may change the test condition each time instructions are received from the host apparatus 200, and test whether the operation circuit 310 is operating properly for each test condition. In this case, the result transmitting section 340 may transmit to the host apparatus 200 test results in which a test condition is associated with a result of whether the operation circuit 310 is operating properly. The host apparatus 200 may generate test information indicating the next test condition to be executed by the diagnostic circuit 320, according to the received test results.

Upon receiving instructions for executing a margin test from the host apparatus 200, the diagnostic circuit 320 may perform a margin test by sequentially changing the test condition and performing, in series, judgments as to whether the operation circuit 310 is operating properly for each test condition. The control information storage section 360 may store control information of a program or the like for executing the margin test.

The diagnostic control circuit 330 controls the type of test performed by the diagnostic circuit 320. For example, the diagnostic control circuit 330 may input to the diagnostic circuit 320 control information for controlling the diagnostic circuit 320. This control information may be a test program that causes the diagnostic circuit 320 to function. This control information may include a setting value to be stored in a register provided to the diagnostic circuit 320. If the diagnostic circuit 320 is capable of executing a plurality of tests, the control information may designate which test is to be executed.

The diagnostic control circuit 330 receives test information, which indicates test content to be performed on the operation circuit 310 by the diagnostic circuit 320, from the host apparatus 200 via the communicating section 110 and the network 20. The diagnostic control circuit 330 may cause the diagnostic circuit 320 to perform a test according to the test information by inputting control information corresponding to the test information into the diagnostic circuit 320.

The test information may be the control information, or may be information designating control information. For example, if the control information storage section 360 stores a plurality of test programs or the like as the plurality of pieces of control information corresponding to a plurality of pieces of test content, the diagnostic control circuit 330 may extract from the control information storage section 360 the test program or the like that is indicated by the received test information. The diagnostic control circuit 330 may cause the diagnostic circuit 320 to execute a test by using the control information of the test program or the like extracted from the control information storage section 360.

The result storage section 370 stores the test results of the diagnostic circuit 320. The diagnostic control circuit 330 may receive the test results from the diagnostic circuit 320 and store the test results in the result storage section 370. The result transmitting section 340 transmits the test results of the diagnostic circuit 320 to the host apparatus 200 via the network 20. The result transmitting section 340 may transmit the test results together with the identification information of the electronic device 300. The identification information of the electronic device 300 may identify an individual device from among a plurality of devices, and may be a serial number of the electronic device 300 or the like. The electronic device 300 may record information that is unique to the electronic device 300 in a fuze ROM or an EPROM section provided in the electronic device 300.

The identification information of the electronic device 300 may instead be a network address, such as an IP address or MAC address of the user apparatus 100. In this case, the electronic device 300 separately records information concerning the correspondence between (i) the serial number of the each electronic device 300 loaded in a user apparatus 100 and (ii) a unique number, such as an IP address, of the user apparatus 100. The serial number of the electronic device 300 can then be obtained from the correspondence information and the unique number of the user apparatus 100. As another example, when the user apparatus 100 is manufactured, unique individual information, such as a serial number of the electronic device loaded in the user apparatus 100, may be recorded in a recording medium provided to the user apparatus 100. In this case, the recording medium provided to the user apparatus 100 may be a flash memory, a hard disk, or the like. The result transmitting section 340 may send the test results to the host apparatus 200 using a communication function, e.g. the communicating section 110, of the user apparatus 100.

The electronic device 300 may store, along with the unique identification information, information, such as a server IP address, indicating a transmission destination or return destination of the test result and a request destination of the test control information. Based on this information, the user apparatus 100 into which the electronic device 300 is loaded can acquire the necessary test information, execute the test, and transmit the test result associated with the identification information to the necessary location.

When the electronic device 300 is implemented in the user apparatus, the result transmitting section 340 is desirably provided so as to be capable of communication via the communicating section 110. The result transmitting section 340 may be provided in a manner to be capable of inputting to the communicating section 110 the data of the test result received from the diagnostic control circuit 330 and address data of the host apparatus 200. The address data of the host apparatus 200 may be written in advance to the result transmitting section 340 upon shipping of the electronic device 300. If the operation circuit 310 can communicate with an external section via the communicating section 110, the diagnostic control circuit 330 may cause the operation circuit 310 to function as the result transmitting section 340.

The test information requesting section 350 requests transmission of the test information from the host apparatus 200 via the network 20. The address data of the host apparatus 200 may be written to the test information requesting section 350 upon shipping of the electronic device 300. Instead, the test information requesting section 350 may use the communicating section 110 to request the test information from the host apparatus 200. For example, the test information requesting section 350 may request from the host apparatus 200 transmission of test information indicating which piece of control information is to be used for the next test from among pieces of control information stored in the control information storage section 360. Instead, the test information requesting section 350 may request from the host apparatus 200 in advance the test information that indicates the test content to be executed next by the diagnostic circuit 320. As another example, the test information requesting section 350 may request the test information from the electronic device 300 by notifying the host apparatus 200 concerning the identification information of the electronic device 300.

With this configuration, the electronic device 300 can perform margin measurement, operational tests of the operation circuit 310, and the like while the electronic device 300 is in a variety of usage environments. Furthermore, by writing the address of the host apparatus 200 to the electronic devices 300 in advance, each electronic device 300 can request communication establishment with the host apparatus 200.

Figure 3:
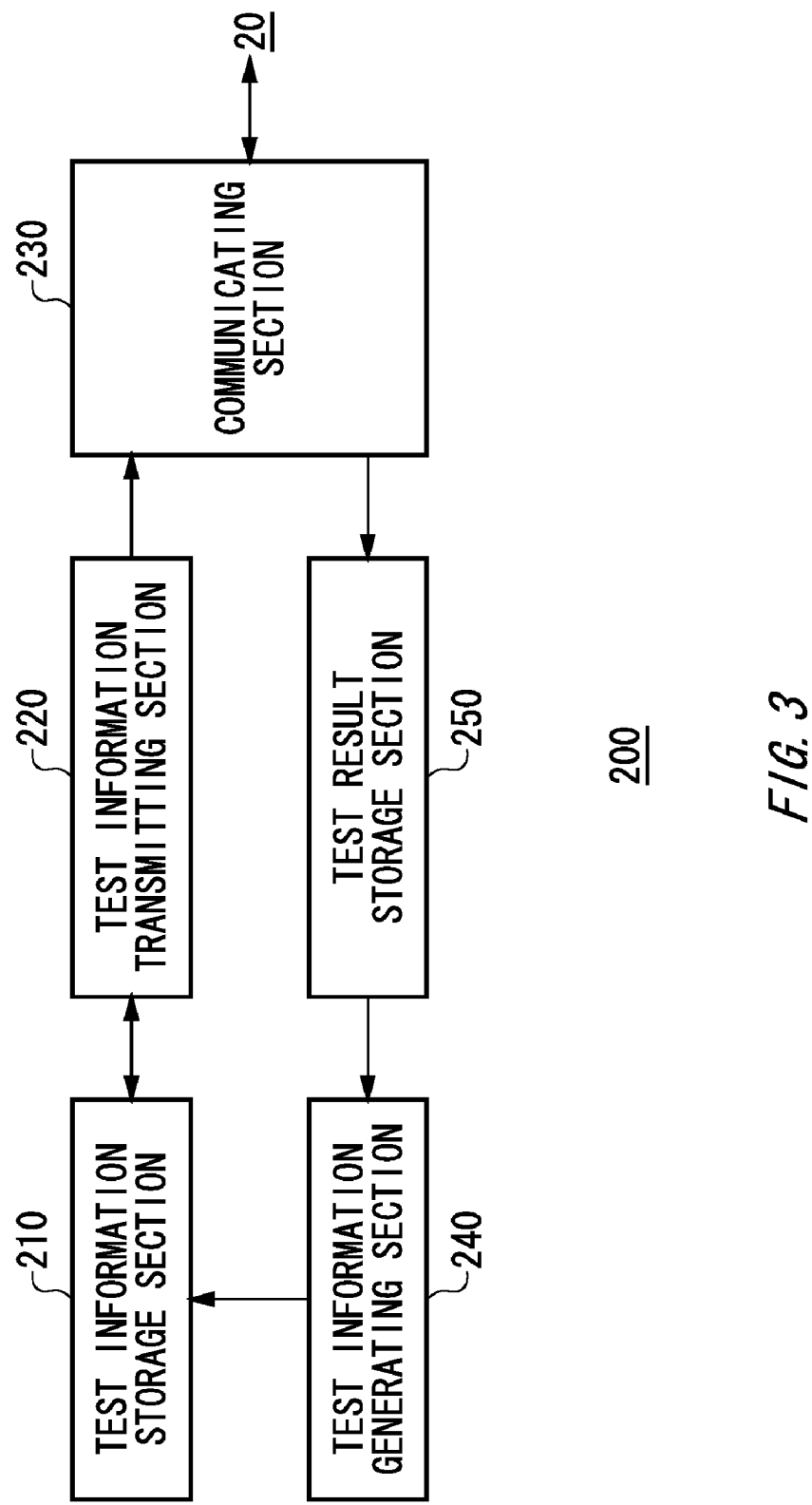
FIG. 3 shows an exemplary configuration of the host apparatus 200.

FIG. 3 shows an exemplary configuration of the host apparatus 200. The host apparatus 200 includes a test information storage section 210, a test information transmitting section 220, a communicating section 230, a test information generating section 240, and a test result storage section 250. The host apparatus 200 communicates with a user apparatus 100 in which is implemented an electronic device 300 housing a diagnostic circuit 320, via the network 20.

The communicating section 230 communicates with the user apparatus 100 via the network 20. The communicating section 230 can desirably communicate simultaneously with a plurality of user apparatuses 100. If each electronic device 300 is capable of requesting communication establishment, the communicating section 230 may receive address data and identification information for each electronic device 300. The communicating section 230 may store the identification information and the address data in association with each other. The communicating section 230 may use the stored identification information and address data to request communication establishment with each electronic device 300.

The test information storage section 210 stores in advance the test information indicating the test content to be executed by the user apparatus 100. The test information storage section 210 may store, as the test information, a test program that causes the diagnostic circuit 320 to function or data that designates control information stored in the control information storage section 360.

When an electronic device 300 requests test information, the test information transmitting section 220 reads the test information from the test information storage section 210 and transmits the test information to the electronic device 300.

The test information transmitting section 220 may communicate with the electronic device 300 via the communicating section 230. The test information transmitting section 220 may read from the test information storage section 210 the test information corresponding to the identification information of the electronic device 300 received along with the test information request. In this way, each electronic device 300 can be tested.

The test result storage section 250 stores the tests results received from the electronic device 300. The test result storage section 250 may receive the test results via the communicating section 230. The test result storage section 250 may store the test results in association with the identification information of the electronic device 300.

The test information generating section 240 generates the test information to be executed next by the diagnostic circuit 320 of the electronic device 300, based on the received test results, and stores the test information in the test information storage section 210. For example, the test information generating section 240 may sequentially generate test information that causes the diagnostic circuit 320 to execute the margin test described in relation to FIG. 2. In this case, the test information generating section 240 may receive from the electronic device 300 information indicating whether the operation circuit 310 operated properly, along with the test condition used. The test information generating section 240 may then sequentially generate, as the test information to be executed next by the diagnostic circuit 320, test information whose test condition has been changed according to the received test result.

If the received test result indicates that operation circuit 310 is not operating properly, the test information generating section 240 may generate the next piece of test information to indicate execution of a test that identifies a defective location in the operation circuit 310. For example, the test information generating section 240 may generate, as the next piece of test information, information that indicates execution of a scan test of the operation circuit 310. The scan test of the operation circuit 310 may involve using a scan chain having a connection path differing from the connection path of flip-flops in the operation circuit 310 used during actual operation, to input pattern data into each flip-flop. The test information generating section 240 may store in the test information storage section 210 the identification information of the electronic device 300 corresponding to the test result in association with the generated test information that resulted in the test result.

The test information generating section 240 may store in advance, and in order, a plurality of pieces of test information that are to be executed in common by the electronic devices 300. In this case, the test information generating section 240 may set the piece of test information up to which the ordered plurality of pieces of test information are to be executed for each electronic device 300, based on the received test results. The test information generating section 240 then generates test information to be executed next by each electronic device 300 for each test result, and stores the test information in the test information storage section 210. The test information generating section 240 may generate these plurality of pieces of test information to be executed by each electronic device 300 over predetermined time periods. The test information generating section 240 may interrupt the flow of test information to be executed by each electronic device 300 by inserting test information indicating test content designated by a user or the like.

With this configuration, the host apparatus 200 can manage tests to be executed by a plurality of electronic devices 300. Furthermore, since test information to be executed next by each electronic device 300 is stored so as to be transmittable to the user apparatus 100 upon request, the test information can be transmitted to each user apparatus 100 while the user apparatus 100 is in a state suitable for communication of the test information. Therefore, the test information can be appropriately transmitted to a plurality of electronic devices 300. In addition, the test results obtained by the plurality of electronic devices 300 can be collected by the host apparatus 200. Therefore, the variation in the margin of error for a certain usage environment of an electronic device 300 can be accurately analyzed.

Figure 4:
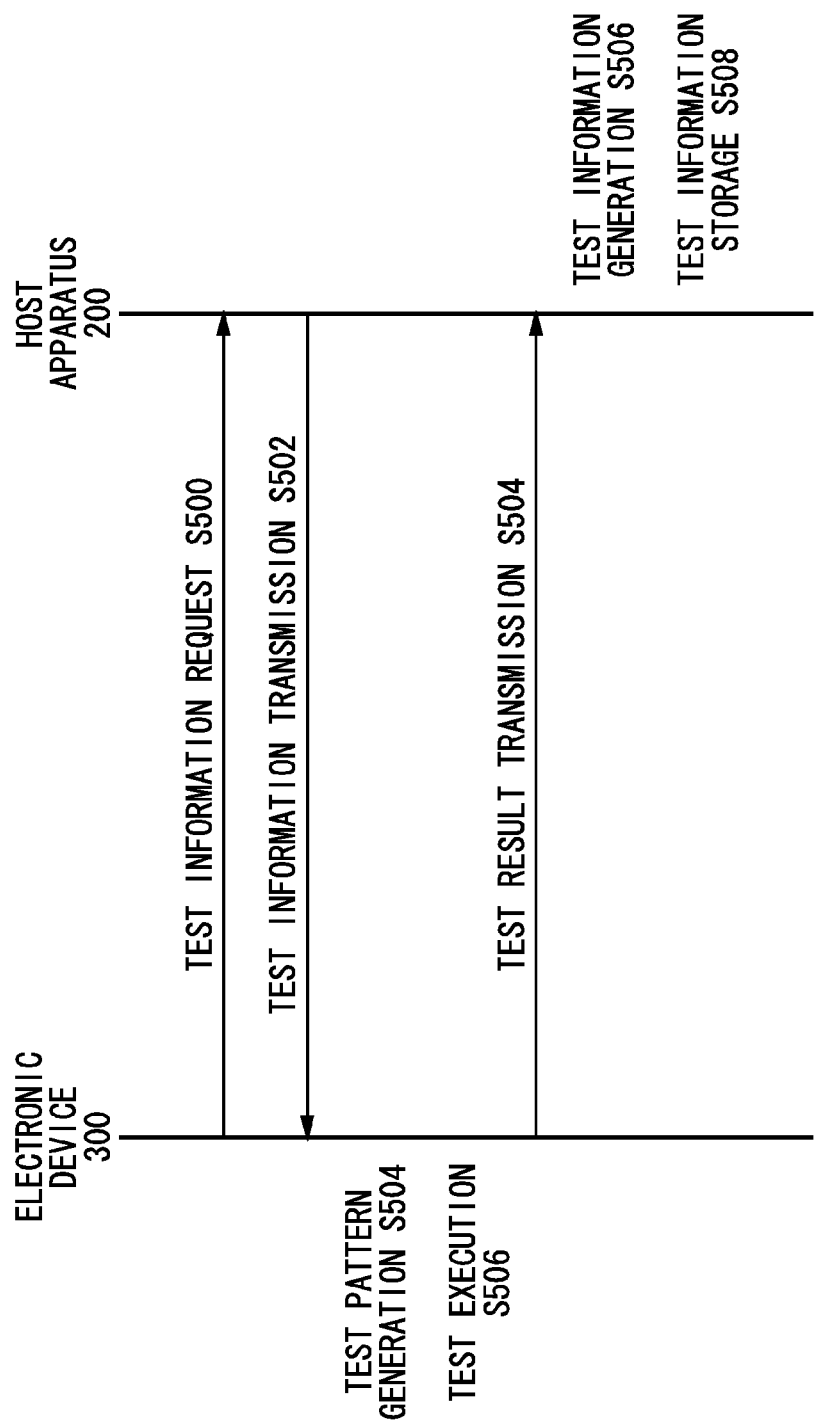
FIG. 4 is a chart showing an exemplary operation of the electronic device 300 and the host apparatus 200.

FIG. 4 is a chart showing an exemplary operation of the electronic device 300 and the host apparatus 200. First, the test information requesting section 350 of the electronic device 300 requests test information from the host apparatus 200 (S500). The test information transmitting section 220 of the host apparatus 200 reads the test information from the test information storage section 210 in response to the test information request, and transmits the test information to the electronic device 300 (S502). The test information storage section 210 stores the test information in advance.

The diagnostic control circuit 330 of the electronic device 300 generates the control information, such as a test pattern, based on the received test information (S504). The diagnostic circuit 320 executes a test based on the control information (S506). The result transmitting section 340 transmits the test results to the host apparatus 200 (S508).

The test result storage section 250 of the host apparatus 200 stores the received test results. The test information generating section 240 generates the next piece of test information based on the received test results (S510). The test information storage section 210 stores the next piece of test information (S512). By repeating this process, the host apparatus 200 can manage testing of each electronic device 300.

When the result transmitting section 340 transmits the test results to the host apparatus 200, the test information requesting section 350 may request the next piece of test information to be executed. Prior to the test information requesting section 350 requesting the test information, the diagnostic control circuit 330 may cause the diagnostic circuit 320 to execute the test corresponding to the test information that has already been provided.

The test information requesting section 350 may transmit the test results to the host apparatus 200 together with the test information request. As described above, the host apparatus 200 may generate the next piece of test information according to the test results. With this process, the host apparatus 200 can test each electronic device 300 and collect the test results.

Figure 5:
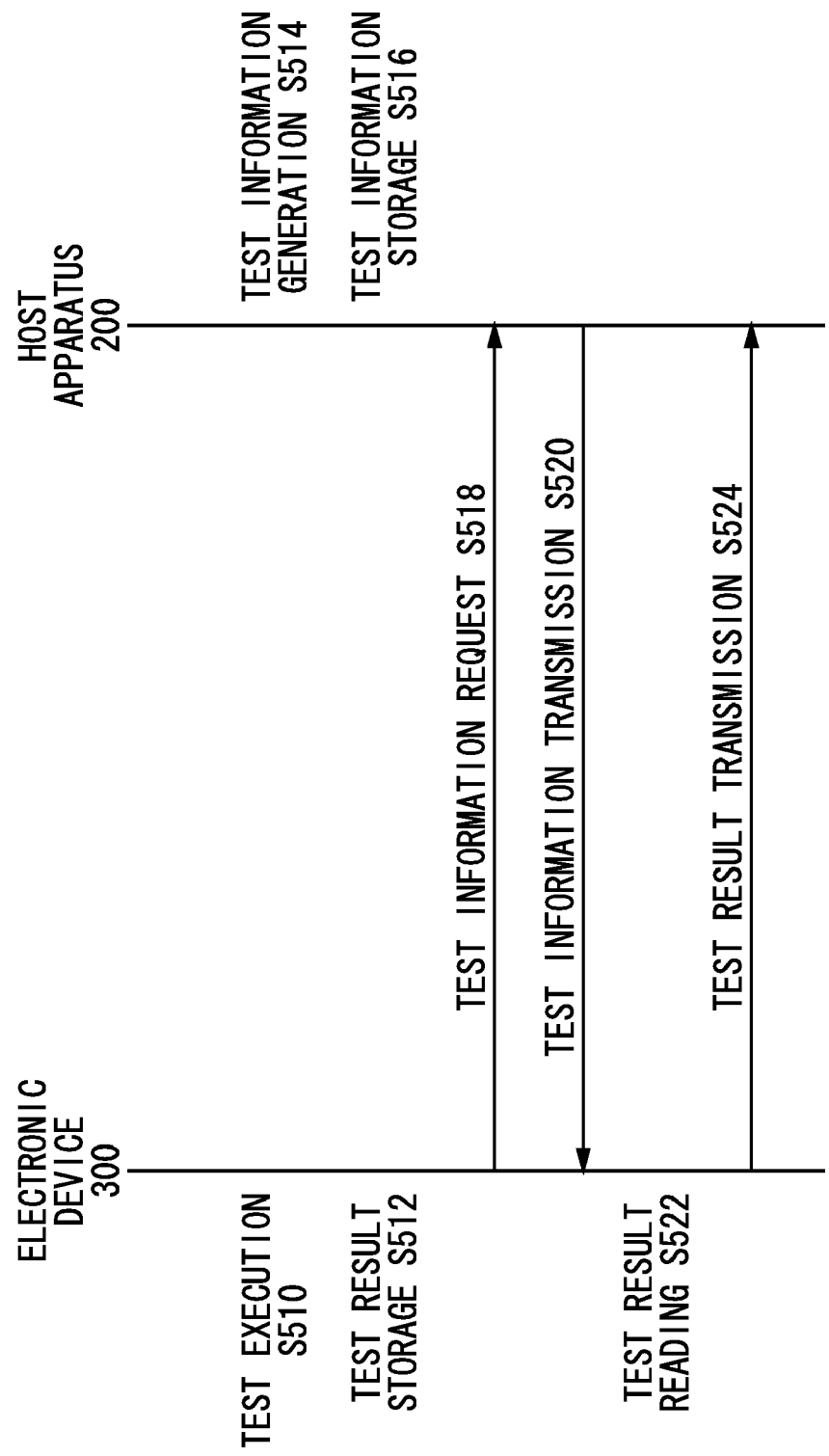
FIG. 5 is a chart showing another exemplary operation of the electronic device 300 and the host apparatus 200.

FIG. 5 is a chart showing another exemplary operation of the electronic device 300 and the host apparatus 200. The diagnostic circuit 320 of the present embodiment performs testing in advance at a timing at which testing of the operation circuit 310 is possible (S510). For example, the diagnostic circuit 320 may perform the testing at a timing during which the operation circuit 310 is not actually operating, such as during start-up or shut-down of the user apparatus 100. The diagnostic circuit 320 tests the operation circuit 310 in advance using a plurality of pieces of test content. For example, the diagnostic circuit 320 may test the operation circuit 310 in advance using all possible pieces of test content, or may test the operation circuit 310 in advance using certain predesignated pieces of test content. The result storage section 370 stores the test results in association with the test content used, e.g. test information or control information (S512).

The host apparatus 200 generates the test information to be performed by each electronic device 300 (S514) and stores the test information (S516). This test information may designate certain pieces of control information stored in the control information storage section 360.

After the result storage section 370 has stored the test results, the test information requesting section 350 requests from the host apparatus 200 transmission of test information indicating which test results are to be sent to the host apparatus 200 from among the test results stored in the result storage section 370 (S518). For example, the test information requesting section 350 may request the test information transmission at a timing that is suitable for sending and receiving of the test information and the test results. More specifically, the test information requesting section 350 may request the test information transmission at a timing during which no other information is being communicated between the electronic device 300 and the host apparatus 200, such as during the start-up or the shut-down of the user apparatus 100.

The test information transmitting section 220 of the host apparatus 200 transmits the test information to the electronic device 300 in response to the request for test information transmission (S520). The result transmitting section 340 reads from the result storage section 370 the test results corresponding to this test information (S522). The result transmitting section 340 transmits the read test results to the host apparatus 200 (S524). With this process, the host apparatus 200 can test each electronic device 300 and collect the test results, without affecting the operation of the user apparatuses 100.

Figure 6:
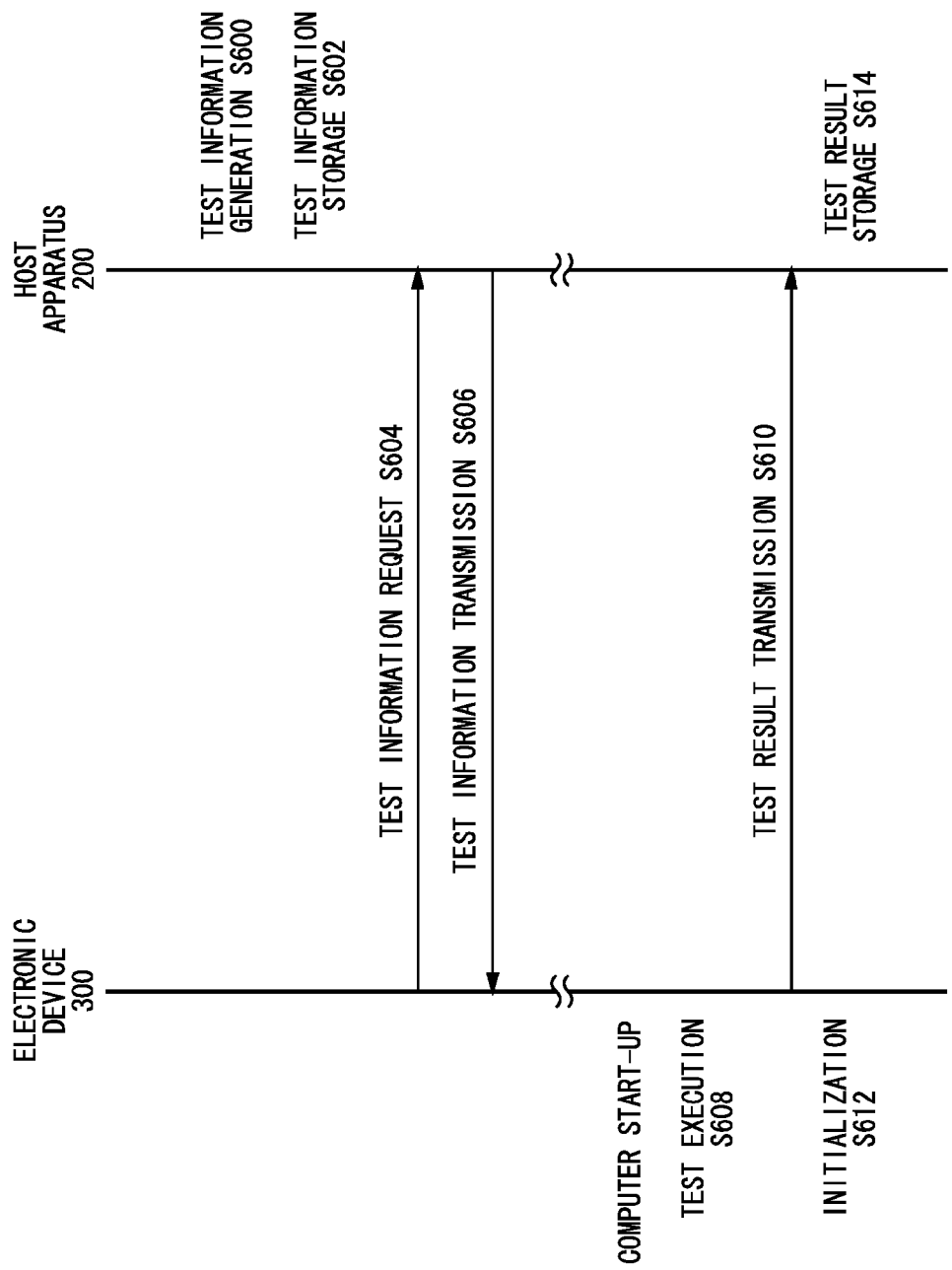
FIG. 6 is a chart showing another exemplary operation of the electronic device 300 and the host apparatus 200.

FIG. 6 is a chart showing another exemplary operation of the electronic device 300 and the host apparatus 200. The electronic device 300 of the present embodiment is implemented in a computer serving as the user apparatus 100, and tests the operation circuit 310 during start-up of the user apparatus 100.

The host apparatus 200 generates in advance test information indicating test content to be executed by each electronic device 300 (S600) and stores the test information (S602). The test information requesting section 350 of the electronic device 300 requests test information transmission from the host apparatus 200 (S604). The test information transmitting section 220 of the host apparatus 200 transmits the test information to the electronic device 300 in response to the test information transmission request (S606). The electronic device 300 and the host apparatus 200 may perform the test information transmission request and the test information transmission before communication is dissolved between the electronic device 300 and the host apparatus 200 during the prior shutdown of the user apparatus 100. The electronic device 300 may store the received test information in a non-volatile memory.

During start-up of the user apparatus 100, the diagnostic circuit 320 performs a test on the operation circuit 310 corresponding to the test information received in advance (S608). For example, the diagnostic circuit 320 may test the operation circuit 310 before the operation circuit 310 begins actual operation as a component of the user apparatus 100. The diagnostic circuit 320 may instead test the operation circuit 310 while communication is established between the user apparatus 100 and the host apparatus 200.

The result transmitting section 340 transmits the test results to the host apparatus 200 (S610). After testing of the operation circuit 310 is finished, the diagnostic circuit 320 initializes the operation circuit 310 (S612). For example, the diagnostic circuit 320 may initialize the values set in each register of the operation circuit 310 as a result of the testing. In this way the operation circuit 310 can be prevented from mistakenly using the information set during testing as the information used during actual operation.

The test result storage section 250 of the host apparatus 200 stores the received test results (S614). With this process, each electronic device 300 can be tested and the test results can be collected, without affecting the operation of the user apparatuses 100.

Figure 7:
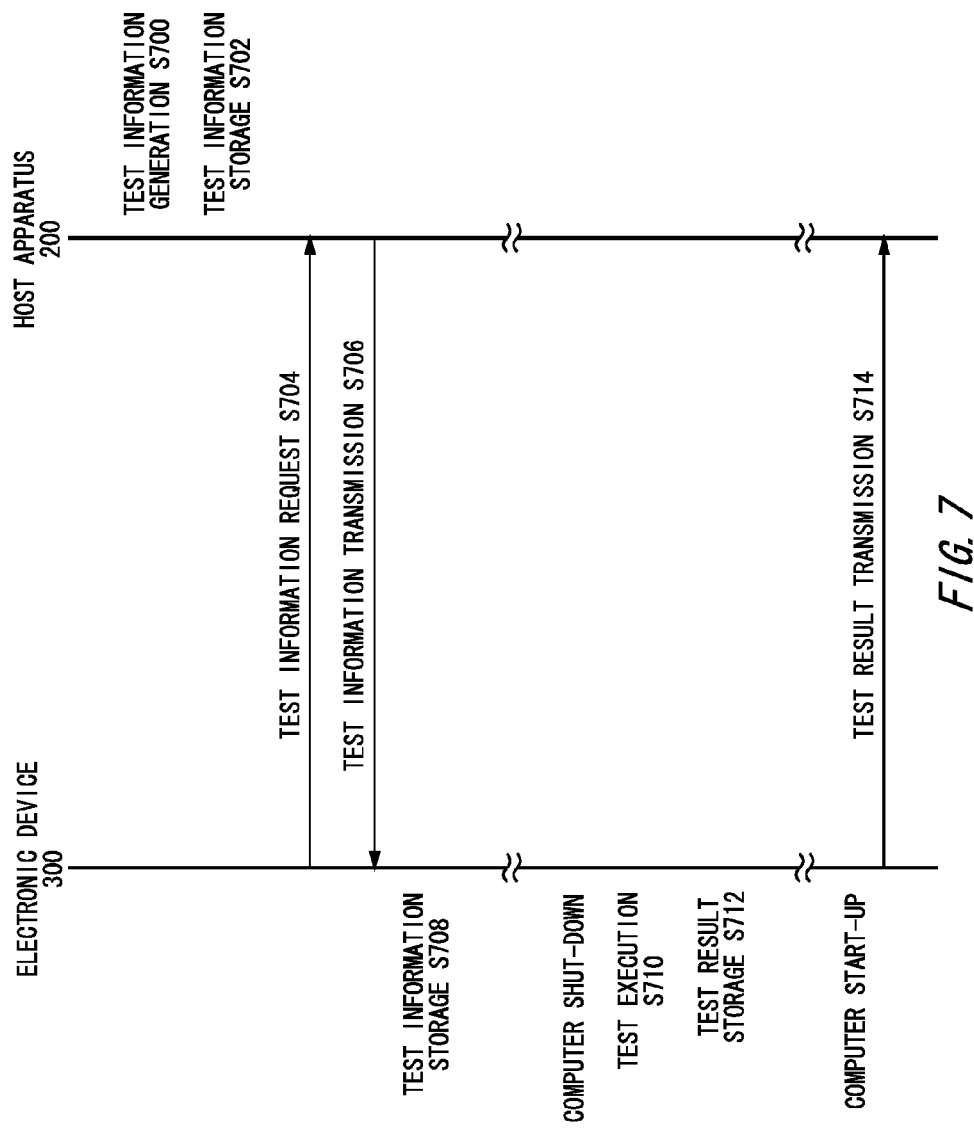
FIG. 7 is a chart showing another exemplary operation of the electronic device 300 and the host apparatus 200.

FIG. 7 is a chart showing another exemplary operation of the electronic device 300 and the host apparatus 200. The electronic device 300 of the present embodiment is implemented in a computer serving as the user apparatus 100, and tests an operation circuit 310 during shut-down of the user apparatus 100.

The host apparatus 200 generates in advance test information indicating test content to be executed by each electronic device 300 (S700) and stores the test information (S702). The test information requesting section 350 of the electronic device 300 requests test information transmission from the host apparatus 200 (S704). The test information transmitting section 220 of the host apparatus 200 transmits the test information to the electronic device 300 in response to the test information transmission request (S706). The electronic device 300 stores the received test information (S708). The electronic device 300 and the host apparatus 200 may perform the test information transmission request and the test information transmission after communication is established between the electronic device 300 and the host apparatus 200 during the start-up of the user apparatus 100. The electronic device 300 may store the received test information in a non-volatile memory. As another example, the testing, test information acquisition, and transmission may be executed as needed by a user or maintenance personnel performing an inspection or upkeep.

The diagnostic circuit 320 tests the operation circuit 310 during shut-down of the user apparatus 100 (S710). The diagnostic circuit 320 performs a test on the operation circuit 310 that corresponds to test information that has already been received. For example, the diagnostic circuit 320 may test the operation circuit 310 after the operation circuit 310 finishes actual operation as a component of the user apparatus 100. The result storage section 370 stores the test results (S712). The result storage section 370 is desirably a non-volatile memory that can hold the stored information even when the user apparatus 100 is not supplied with power.

The result transmitting section 340 reads the test results stored in the result storage section 370 during start-up of the user apparatus 100, and transmits the test results to the host apparatus 200 (S714). At this time, the test information requesting section 350 may request transmission of the next piece of test information. With this process, each electronic device 300 can be tested and the test results can be collected, without affecting the operation of the user apparatuses 100.

Figure 8:
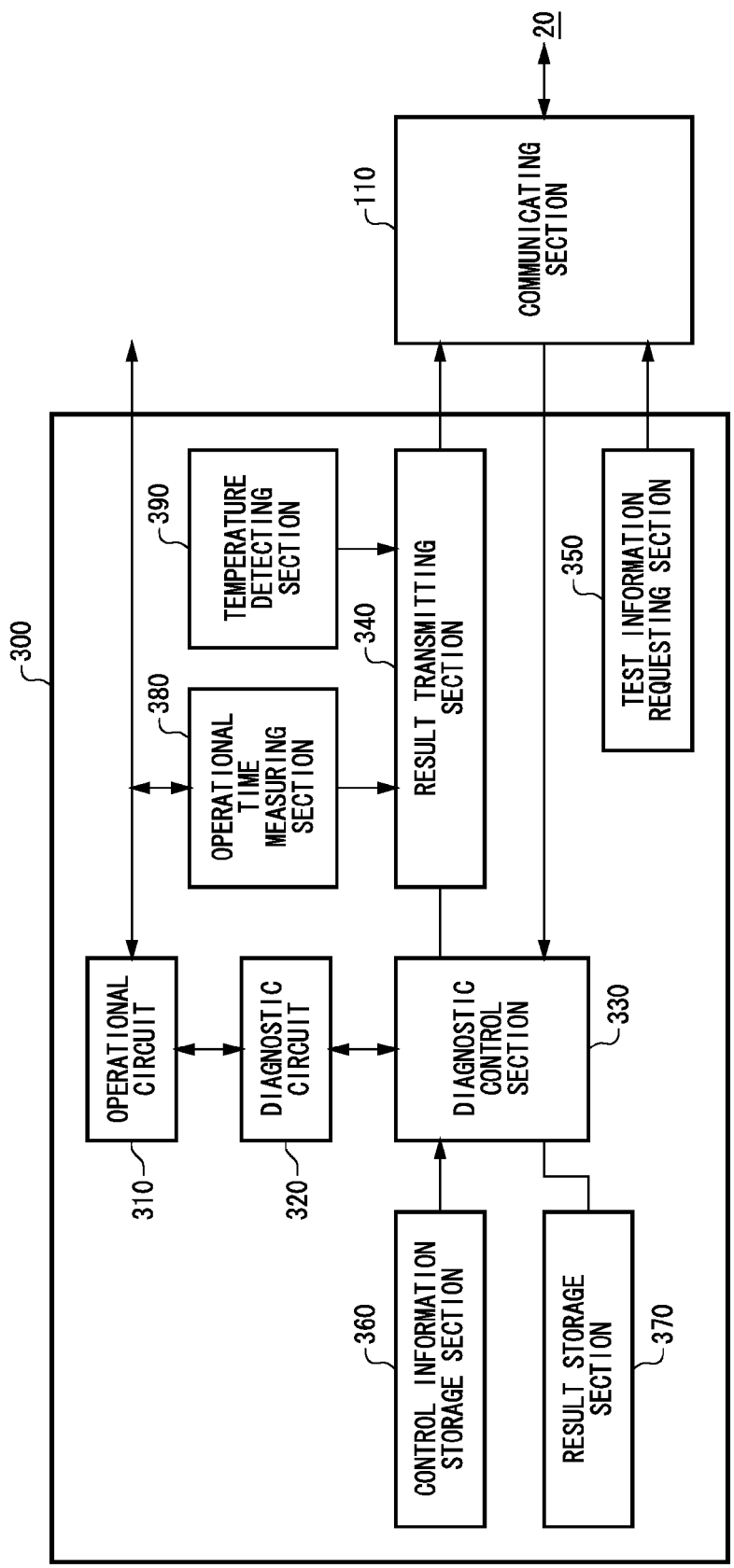
FIG. 8 shows another exemplary configuration of the electronic device 300.

FIG. 8 shows another exemplary configuration of the electronic device 300. The electronic device 300 of the present embodiment further includes an operational time measuring section 380 and a temperature detecting section 390 in addition to the configuration of the electronic device 300 described in relation to FIG. 2. The remaining configuration of the electronic device 300 of the present embodiment may be the same as that of the electronic device 300 described in relation to FIG. 2.

The temperature detecting section 390 detects the temperature of the electronic device 300. For example, the temperature detecting section 390 may detect the temperature of the electronic device 300 based on a resistance value of a temperature measuring resistance element, such as a thermistor, provided to the electronic device 300 or based on a temperature measuring means that performs a measurement according to a characteristic change due to the temperature of the semiconductor. The temperature detecting section 390 may detect the temperature of the electronic device 300 when the diagnostic circuit 320 is performing each of the tests. The temperature detecting section 390 may detect and hold temperature changes over constant intervals during actual operation of the electronic device. The temperature detecting section 390 may record minimum temperatures and maximum temperatures, or the like.

The result transmitting section 340 may transmit the test results from the diagnostic circuit 320 to the host apparatus 200 in association with the temperature of the electronic device 300 detected by the temperature detecting section 390 during the corresponding test. In this way, the host apparatus 200 can collect test results for each temperature of the electronic device 300. Therefore, the host apparatus 200 can collect test results for various usage environments of the operation circuit 310, and analyze the required margin of error or the like. Furthermore, the host apparatus 200 can obtain a temperature change history of the electronic device 300 in an operational state and use this information for analysis as necessary.

The operational time measuring section 380 measures the total operational time of the operation circuit 310. The total operational time of the operation circuit 310 may be the aggregate of the time during which supply power is provided to the operation circuit 310. Instead, the total operational time of the operation circuit 310 may be the aggregate of each time period from (i) when a signal is input from the user apparatus 100 to the operation circuit 310 to (ii) when a signal is output from the operation circuit 310 to the user apparatus 100. As another example, the operational time measuring section 380 may measure the total operational time of the operation circuit 310 to be the aggregate of each time period from start-up to shut-down of the user apparatus 100.

The result transmitting section 340 may transmit the test results from the diagnostic circuit 320 to the host apparatus 200 in association with the total operational time of the operation circuit 310 at the timing when the test was initiated. In this way, the host apparatus 200 can collect test results for each temperature of the electronic device 300. Therefore, the host apparatus 200 can collect test results for various usage environments of the operation circuit 310, and analyze the rate of decay or the like.

The user apparatus 100 may have a function to detect a position at which the user apparatus 100 is positioned, such as a GPS function. In this case, the result transmitting section 340 may transmit the test results from the diagnostic circuit 320 to the host apparatus 200 in association with the position of the user apparatus 100. The types of information described above concerning temperature, operational time, and location are merely examples of information used to evaluate usage environments, and information concerning other usage environments may be obtained using devices such as a humidity sensor, a condensation sensor, a radiation sensor, an acceleration sensor, a magnetic field sensor, or the like.

Figure 9:
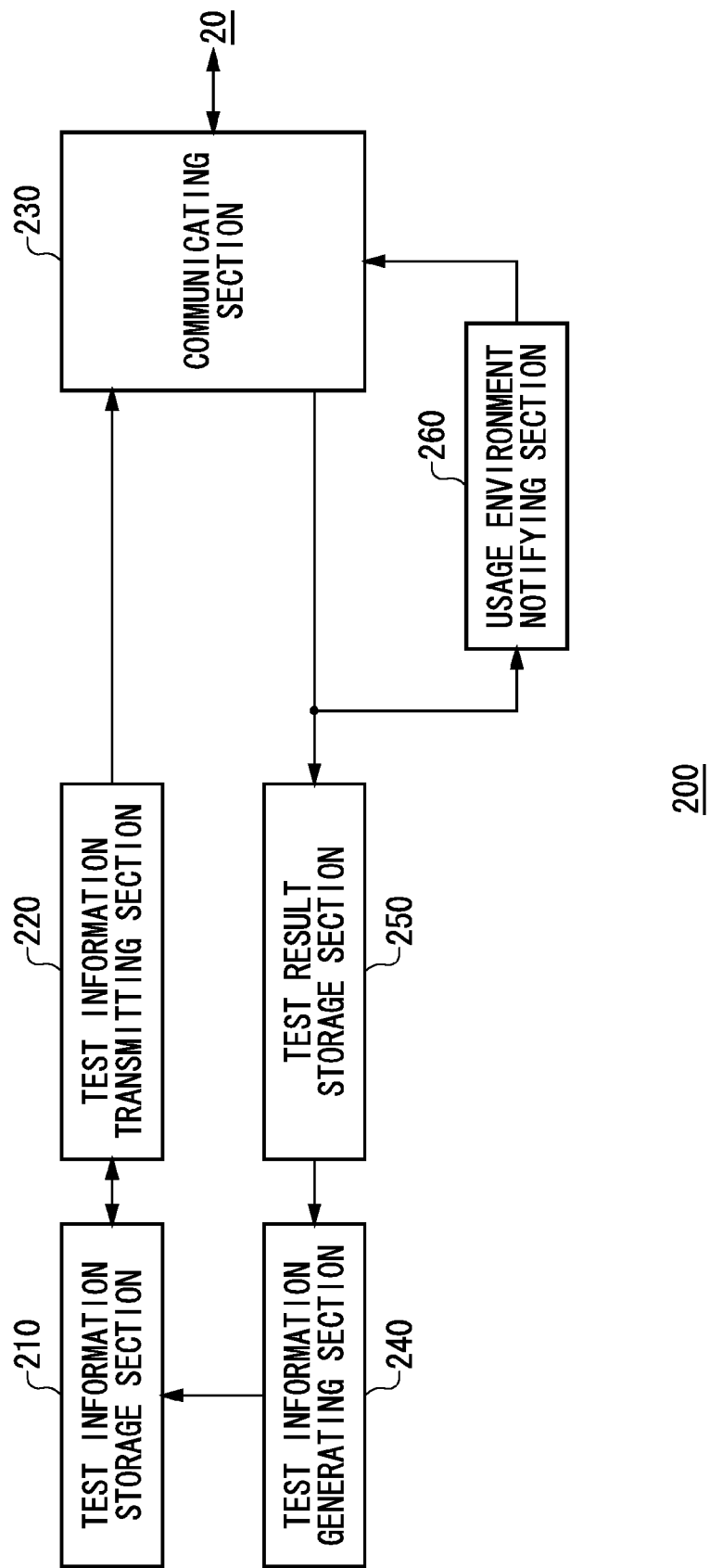
FIG. 9 shows another exemplary configuration of the host apparatus 200.

FIG. 9 shows another exemplary configuration of the host apparatus 200. The host apparatus 200 of the present embodiment further includes a usage environment notifying section 260 in addition to the configuration of the host apparatus 200 described in relation to FIG. 3. The remaining configuration of the host apparatus 200 of the present embodiment may be the same as that of the host apparatus 200 described in relation to FIG. 3.

The test result storage section 250 receives the test results for each electronic device along with information concerning the corresponding temperature, total operational time, or the like. The test result storage section 250 may function as a correspondence storage section that stores at least one of the temperature or the total operational time in association with the test results.

The test information generating section 240 generates test information indicating the test content to be executed next by the diagnostic circuit 320 of each electronic device 300, based on the temperature information stored by the test result storage section 250 in association with the test results of the electronic device 300, and stores the test information in the test information storage section 210. If the temperature of the electronic device 300 is outside a prescribed temperature range, for example, the test information generating section 240 may generate test information causing a location that is more highly temperature dependent in the operation circuit 310 to operate. If the temperature of the electronic device 300 is above a prescribed temperature, the test information generating section 240 may give priority to generating test information that causes the diagnostic circuit 320 to perform a test for which the operation circuit 310 consumes a relatively small amount of power. With this configuration, each electronic device 300 can be tested while in each of a variety of actual operating environments.

If the temperature of the electronic device 300 indicated by the temperature information is not within the predetermined temperature range according to the specifications or the like, the usage environment notifying section 260 notifies the user apparatus 100 or the electronic device 300 of this fact. The user apparatus 100 informs the user or the like by displaying the received notification, for example. In this way, the user of the user apparatus 100 can be notified that the temperature of the electronic device 300 is irregular. As another example, upon receiving notification that the temperature of the electronic device 300 is not within the prescribed range, the user apparatus 100 may stop supplying power to the electronic device 300. In this way, heating, melting, or the like of the electronic device 300 can be prevented.

Figure 10:
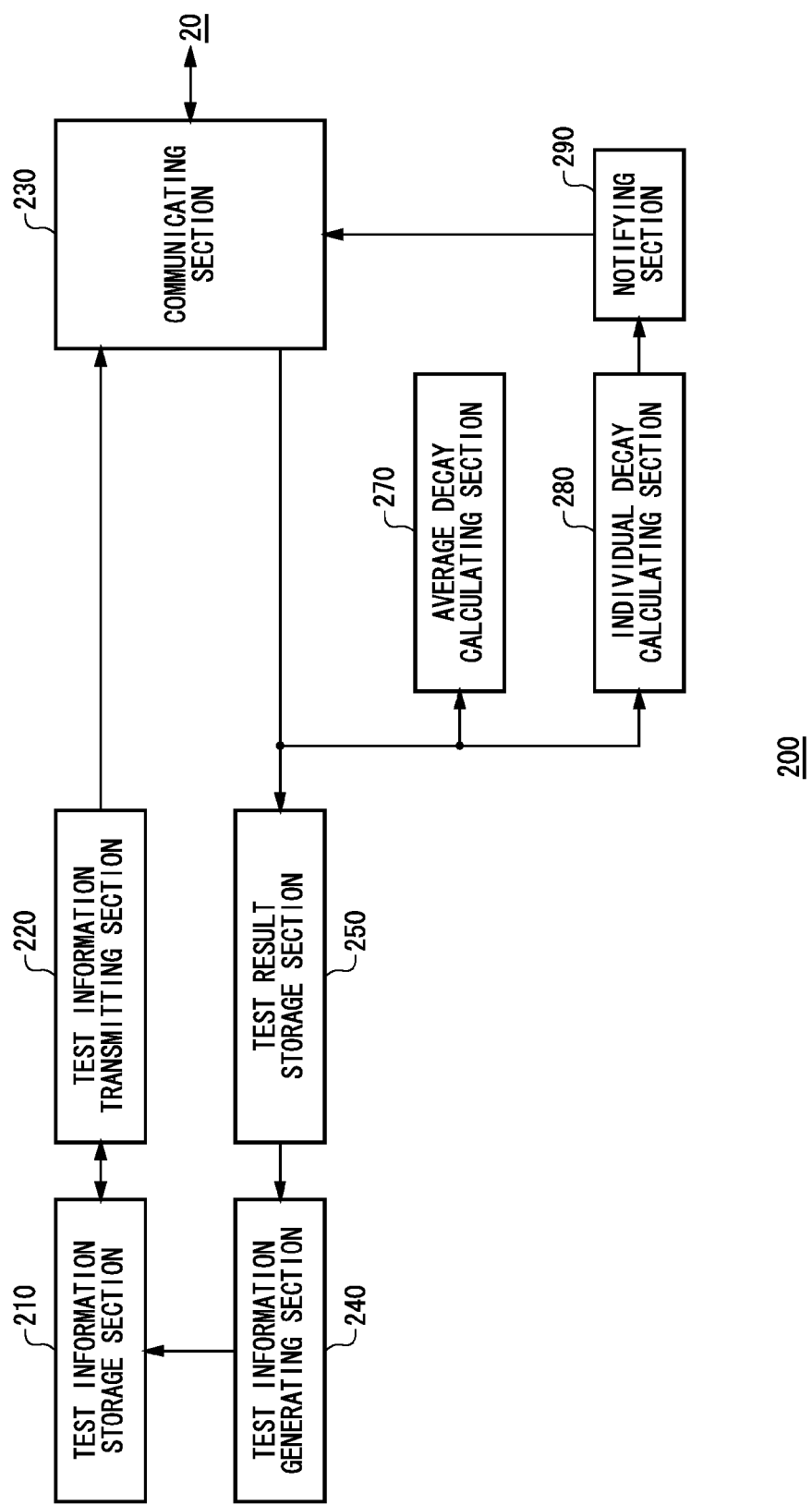
FIG. 10 shows another exemplary configuration of the host apparatus 200.

FIG. 10 shows another exemplary configuration of the host apparatus 200. The host apparatus 200 of the present embodiment further includes an average decay calculating section 270, an individual decay calculating section 280, and a notifying section 290 in addition to the configuration of the host apparatus 200 described in relation to FIG. 3. The remaining configuration of the host apparatus 200 may be the same as that of the host apparatus 200 described in relation to FIG. 3.

The average decay calculating section 270 receives the test results and the total operational time from each of a plurality of types of electronic devices 300 via the communicating section 230. The average decay calculating section 270 calculates an average decay of the various types of electronic devices 300 relative to the operational time, based on the test results and total operational time of each electronic device 300.

For example, the host apparatus 200 may cause the diagnostic circuit 320 of each electronic device 300 to perform a test that measures the bit error rate of the operation circuit 310. The test for measuring the bit error rate may involve measuring the percentage of bits in a data pattern output by the operation circuit 310 that do not correspond to an expected value pattern when a prescribed test pattern is input to the operation circuit 310. In this measurement, the function of an error correction circuit provided to the electronic device 300 may be disabled.

The average decay calculating section 270 may calculate a straight line approximated by applying the least squares technique to the test results of the electronic devices 300 plotted on a graph in which the horizontal axis is total operational time and the vertical axis is the bit error rate. The slope of this line corresponds to the average rate of decay of the bit error rate of the various types of electronic devices 300.

Figure 11:
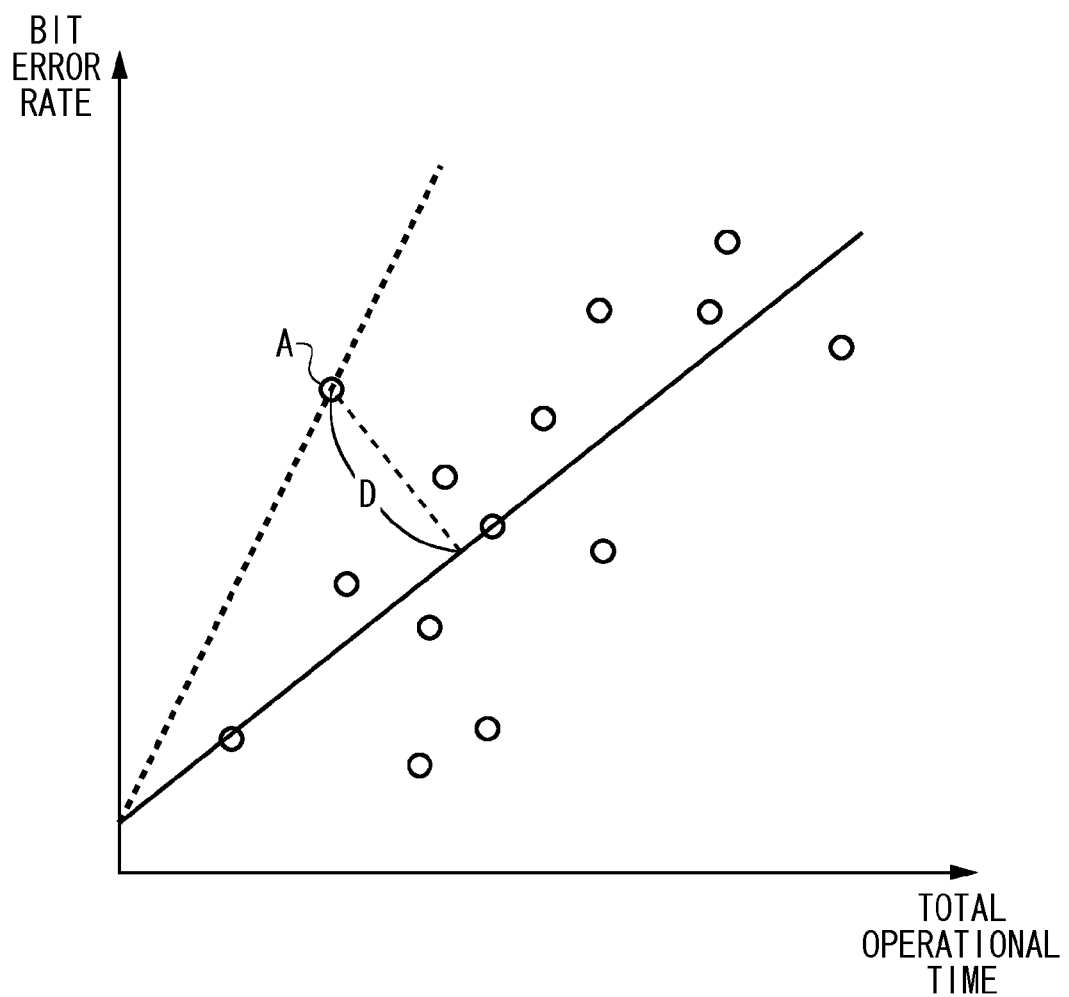
FIG. 11 shows an exemplary average decay rate calculated by the average decay calculating section 270.

FIG. 11 shows an exemplary average rate of decay calculated by the average decay calculating section 270. In FIG. 11, the horizontal axis is the total operational time, the vertical axis is the bit error rate, and the test results of the electronic devices 300 are plotted in this coordinate system. As described above, the average decay calculating section 270 may calculate the slope of a line obtained by approximating the best-fit line of the plotted points.

The individual decay calculating section 280 calculates the rate of decay of each electronic device 300 based on the test results and the total operational time of each electronic device 300. For example, the individual decay calculating section 280 may calculate the rate of decay of the electronic device 300 corresponding to the plotted point A based on the intercept of the line indicating the average decay of the variety of electronic devices 300 and the slope of the line passing through the plotted point A in FIG. 11.

If the rate of decay calculated by the individual decay calculating section 280 is a value that is greater by a prescribed ratio than the average rate of decay calculated by the average decay calculating section 270, the notifying section 290 may notify the electronic device 300 or the user apparatus 100 of this fact. Here, the prescribed ratio includes a case in which dividing an individual rate of decay by the average rate of decay results in a value greater than 1. In other words, the notifying section 290 may notify the user apparatus 100 or the electronic device 300 concerning any electronic device 300 whose rate of decay is greater than the average rate of decay by more than a prescribed ratio. Upon receiving this notification, the user apparatus 100 may inform the user by displaying the notification, for example.

The individual decay calculating section 280 may calculate a distance D between the plotted point A and the line indicating the average rate of decay to be the rate of decay of the electronic device 300 corresponding to the plotted point A. If the distance D is greater than a prescribed value, the notifying section 290 may inform the electronic device 300 or the user apparatus 100 of this fact.

The test performed by the diagnostic circuit 320 is not limited to measuring the bit error rate of the operation circuit 310. The diagnostic circuit 320 may perform a test to measure a prescribed characteristic of the operation circuit 310. In this case, the average decay calculating section 270 may calculate the rate of decay for the prescribed characteristic.

For example, the diagnostic circuit 320 may perform a timing margin test on the operation circuit 310 by sequentially changing the relative phase of a clock signal and a data signal input to the flip-flops in the operation circuit 310 and judging, for each relative phase, whether the data output by the flip-flops matches an expected value. In this case, the diagnostic circuit 320 may calculate the timing margin of the operation circuit 310 based on a range of relative phases for which the data output by the flip-flops matches the expected value.

The diagnostic circuit 320 may perform a clock frequency margin test by sequentially changing the frequency of the clock signal input to the operation circuit 310 and judging, for each frequency of the clock signal, whether the operation circuit 310 is operating properly. In this case, the diagnostic circuit 320 may calculate the clock signal frequency margin based on the range of frequencies of the clock signal for which the operation circuit 310 operates properly.

The diagnostic circuit 320 may perform a power supply voltage margin test by sequentially changing the power supply voltage supplied to the operation circuit 310 and judging, for each power supply voltage, whether the operation circuit 310 is operating properly. In this case, the diagnostic circuit 320 may calculate the power supply voltage margin based on the range of power supply voltages for which the operation circuit 310 can operate properly. The host apparatus 200 may analyze the decay of any of the operational margins described above.

For example, the individual decay calculating section 280 may receive an operational margin and a total operational time of the electronic device 300 from the electronic device 300, and calculate the rate of decay of the operational margin based on the total operational time and the operational margin. The individual decay calculating section 280 may receive from the electronic device 300 the total operational time and the operational margin received earlier, and calculate the rate of decay of the operational margin in the electronic device 300 based on the difference between (i) the earlier total operational time and operational margin and (ii) the current total operational time and operational margin.

The individual decay calculating section 280 calculates an operational defect occurrence period during which the operational margin of the electronic device 300 is less than a predetermined value, based on the calculated rate of decay and the current operational margin. This predetermined value may be may be determined according to predetermined specifications of the electronic device 300. The individual decay calculating section 280 may notify the user of the user apparatus 100 or the user of the host apparatus 200 concerning the calculated operational defect occurrence period. With this process, a user can be notified when maintenance or the like is necessary, and maintenance or the like of the user apparatus 100 can be performed at suitable times.

Figure 12:
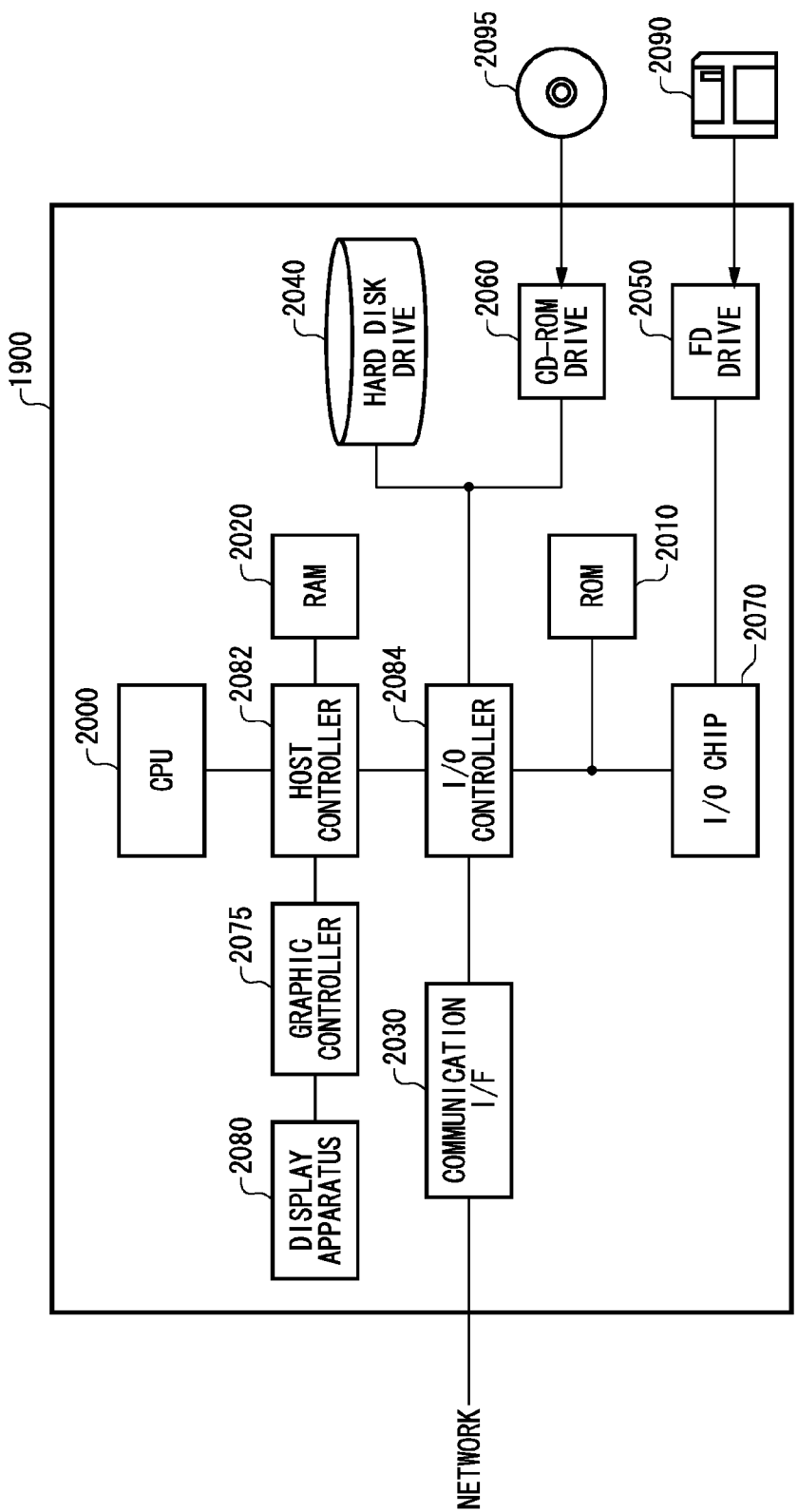
FIG. 12 shows an example of a hardware configuration of a computer 1900 according to an embodiment of the present invention.

FIG. 12 shows an example of a hardware configuration of a computer 1900 according to an embodiment of the present invention. The computer 1900 may function as the host apparatus 200 described in relation to FIGS. 1 to 11, based on a program supplied thereto. Furthermore, measurement results acquired and managed by the computer 1900 functioning as the host apparatus 200 may be collected, managed, or controlled by a higher level host apparatus through a network to which the computer 1900 is connected. In other words, the test results of the plurality of electronic devices 300 may be managed by a group of host apparatuses having a multi-level configuration.

When the computer 1900 functions as the host apparatus 200, the program may cause the computer 1900 to function as at least one of the test information storage section 210, the test information transmitting section 220, the communicating section 230, the test information generating section 240, the test result storage section 250, the usage environment notifying section 260, the average decay calculating section 270, the individual decay calculating section 280, and the notifying section 290 described in relation to FIGS. 1 to 11. For example, the program may cause a hard disk drive 2040 to function as the test information storage section 210 and the test result storage section 250. The program may cause a CPU 2000 to function as the test information generating section 240, the average decay calculating section 270, and the individual decay calculating section 280. The program may cause an input/output controller 2084 to function as the test information transmitting section 220, the usage environment notifying section 260, and the notifying section 290. The program may cause a communication I/F 2030 to function as the communicating section 230.

The computer 1900 according to the present embodiment is provided with a CPU peripheral including a CPU 2000, a RAM 2020, a graphic controller 2075, and a displaying apparatus 2080, all of which are connected to each other by a host controller 2082; an input/output section including a communication interface 2030, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the displaying apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

The programs are installed in the computer 1900. These programs prompt the CPU 2000 or the like to make the computer 1900 function as each element of the host apparatus 200, as described above.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As described above, the host apparatus 200 and the electronic devices 300 of the present invention can be used to test each electronic device 300 in a variety of usage environments and to collect the test results. Furthermore, each electronic device 300 can be tested according to the usage environment.

The host apparatus 200 and the electronic devices 300 can measure operational margins of a plurality of the electronic devices 300 and changes in the operational margins caused by the operational environment, for example, and can collect these measurement results. Therefore, a decrease or the like in the operational margin can be detected prior to an operational error or the like occurring in the electronic device 300. Since the rate of decrease in the operational margin can be detected, the host apparatus 200 and the electronic devices 300 can estimate a period during which operational errors will occur in the electronic devices 300. Therefore, maintenance or the like of the user apparatus 100 can be performed at suitable times, and a user can be notified when maintenance or the like is necessary.

In this way, a new decay mode of the electronic device 300 or a correlation between the decay mode and the environment can be detected. Furthermore, in order to perform a more accurate measurement of the decay mode of the electronic device 300 or the correlation between the decay mode and the environment, the host apparatus 200 can designate the test content for each electronic device 300. Therefore, a solution appropriate for the decay of each electronic device 300 can be found, even for electronic devices 300 for which the probability of operational error is not especially high. Furthermore, the data obtained in this manner can be used to achieve a more reliable design.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An electronic device implemented in an apparatus that communicates with a host apparatus via a network, comprising:
   an operation circuit that operates when the electronic device is implemented;
   a diagnostic circuit that tests the operation circuit, the diagnostic circuit performing a margin test that measures a range of a test condition for which the electronic device operates properly; and a result transmitting section that transmits a test result obtained by the diagnostic circuit to the host apparatus via the network.

2. The electronic device according to claim 1, wherein when the electronic device is implemented in an apparatus that has a function to communicate via the network, the result transmitting section uses the communication function of the apparatus to transmit the test result to the host apparatus.

3. The electronic device according to claim 1, further comprising a diagnostic control circuit that receives test information indicating test content to be performed on the operation circuit from the host apparatus via the network, and causes the diagnostic circuit to perform a test corresponding to the received test information.

4. The electronic device according to claim 3, further comprising a test information requesting section that requests transmission of the test information from the host apparatus via the network.

5. The electronic device according to claim 4, further comprising a control information storage section that stores in advance a plurality of pieces of control information of the diagnostic circuit corresponding to a plurality of pieces of the test content, wherein
the diagnostic control circuit causes the diagnostic circuit to perform the test using the control information corresponding to the received test information.

6. The electronic device according to claim 5, wherein the test information requesting section requests, from the host apparatus, transmission of the test information indicating which of the pieces of control information to use.

7. The electronic device according to claim 4, wherein
the diagnostic control circuit causes the diagnostic circuit to perform predetermined test content before the test information requesting section requests transmission of the test information, and
the test information requesting section (i) transmits to the host apparatus the test result obtained by the diagnostic circuit performing the predetermined test content and (ii) requests, from the host apparatus, transmission of the test information indicating the test content to be performed next, according to the test result.

8. The electronic device according to claim 1, wherein
the diagnostic circuit tests the operation circuit in advance using a plurality of pieces of test content,
the electronic device further comprises:
a result storage section that stores test results for the plurality of pieces of test content; and
a test information requesting section that requests, from the host apparatus, transmission of test information indicating which of the test results is to be transmitted, and
the result transmitting section reads from the result storage section the test result corresponding to the test information sent from the host apparatus, and transmits the read test result to the host apparatus.

9. The electronic device according to claim 1, wherein
the electronic device is implemented in a computer, and
the diagnostic circuit tests the operation circuit during start-up of the computer, and initializes the operation circuit after the testing.

10. The electronic device according to claim 9, further comprising a test information requesting section that requests, from the host apparatus, transmission of test information indicating test content to be performed on the operation circuit, during start-up of the computer, wherein the diagnostic circuit performs a test corresponding to the test information received from the host apparatus.

11. The electronic device according to claim 1, wherein
the electronic device is implemented in a computer, and
the diagnostic circuit tests the operation circuit during shut-down of the computer.

12. The electronic device according to claim 11, further comprising a non-volatile result storage section that stores a test result from the diagnostic circuit, wherein
the result transmitting section reads the test result stored in the result storage section during start-up of the computer and transmits the test result to the host apparatus.

13. The electronic device according to claim 1, further comprising a temperature detecting section that detects a temperature of the electronic device, wherein
the result transmitting section transmits to the host apparatus the test result from the diagnostic circuit and the temperature of the electronic device at the time when the test acquiring the test result is performed.

14. The electronic device according to claim 1, further comprising an operational time measuring section that measures total operational time of the operation circuit, wherein
the result transmitting section transmits to the host apparatus the test result from the diagnostic circuit along with the total operational time.

15. The electronic device according to claim 1, wherein
the diagnostic circuit judges whether the operation circuit is operating properly while changing a test condition, and thereby measures a range of the test condition for which the operation circuit operates properly.

16. The electronic device according to claim 1, wherein
the test condition corresponds to test information supplied to the diagnostic circuit, the test information being sequentially generated such that the test condition changes according to the test result.

17. A host apparatus that communicates, via a network, with an apparatus in which is implemented an electronic device housing a diagnostic circuit, the host apparatus comprising:
a test information storage section that stores in advance test information indicating test content to be performed by the diagnostic circuit;
a test information transmitting section that, when the test information is requested by the electronic device, transmits the test information to the electronic device; and
a test information generating section that (i) receives a test result from the diagnostic circuit via the network, (ii) generates the test information indicating the test content to be performed next by the diagnostic circuit, based on the test result, and (iii) stores the test information in the test information storage section, wherein
the diagnostic circuit performs a test that judges whether the electronic device is operating properly in a test condition corresponding to the test information supplied thereto, and
the test information generating section causes the diagnostic circuit to perform a margin test that measures a range of the test condition for which the electronic device operates properly by sequentially generating, as the test information to be performed next by the diagnostic circuit, test information in which the test condition changes according to the test result.

18. The host apparatus according to claim 17, further comprising a correspondence storage section that receives temperature information indicating a temperature of the electronic device when the diagnostic circuit performs a test, and stores the test result in association with the temperature information.

19. The host apparatus according to claim 18, wherein the test information generating section generates the test information indicating the test content to be performed next by the diagnostic circuit, further based on the temperature information corresponding to the test result, and stores the test information in the test information storage section.

20. The host apparatus according to claim 18, further comprising a usage environment notifying section that notifies that electronic device when the temperature indicated by the temperature information is not within a predetermined temperature range.

21. The host apparatus according to claim 17, wherein the diagnostic circuit performs a margin test that sequentially changes the test condition and measures, as an operational margin, the range of the test condition for which the electronic device can operate properly, and the host apparatus further comprises an individual decay calculating section that receives from the electronic device the operational margin and the total operational time of the electronic device, and calculates a rate of decay of the operational margin based on the total operational time and the operational margin.

22. The host apparatus according to claim 21, wherein the individual decay calculating section calculates a time at which the operational margin of the electronic device becomes lower than a predetermined value, based on the calculated rate of decay.

23. A communication system comprising:
the host apparatus according to claim 17; and
the electronic device that is implemented in the apparatus that communicates with the host apparatus via the network, the electronic device including:
an operation circuit that operates when the electronic device is implemented;
the diagnostic circuit, which tests the operation circuit; and
a result transmitting section that transmits a test result obtained by the diagnostic circuit to the host apparatus via the network.

24. A host apparatus that communicates, via a network, with an apparatus in which is implemented an electronic device housing a diagnostic circuit, the host apparatus comprising:
a test information storage section that stores in advance test information indicating test content to be performed by the diagnostic circuit;
a test information transmitting section that, when the test information is requested by the electronic device, transmits the test information to the electronic device;
a test information generating section that (i) receives a test result from the diagnostic circuit via the network, (ii) generates the test information indicating the test content to be performed next by the diagnostic circuit, based on the test result, and (iii) stores the test information in the test information storage section; and
an average decay calculating section that (i) receives, from a plurality of types of the electronic device, the test result of each electronic device and a total operational time of each electronic device and (ii) calculates an average decay of the plurality of types of electronic devices with respect to operational time, based on the total operational times and the test results.

25. The host apparatus according to claim 24, further comprising:
an individual decay calculating section that calculates a rate of decay of each electronic device, based on the test result and the total operational time of the electronic device; and
a notifying section that provides notification when the rate of decay calculated by the individual decay calculating section is greater by a prescribed ratio than the average rate of decay calculated by the average decay calculating section.

26. A communication system comprising:
the host apparatus according to claim 24; and
the electronic device that is implemented in the apparatus that communicates with the host apparatus via the network, the electronic device including:
an operation circuit that operates when the electronic device is implemented;
the diagnostic circuit, which tests the operation circuit; and
a result transmitting section that transmits a test result obtained by the diagnostic circuit to the host apparatus via the network.

27. A recording medium storing thereon a program that causes a computer to function as a host apparatus that communicates, via a network, with an apparatus in which is implemented an electronic device housing a diagnostic circuit, the program causing the computer to function as:
a test information storage section that stores in advance test information indicating test content to be performed by the diagnostic circuit, the test information indicating a margin test that measures a range of a test condition for which the electronic device operates properly; and
a test information transmitting section that, when the test information is requested by the electronic device, transmits the test information to the electronic device.

28. A recording medium storing thereon a program that causes a computer to function as a host apparatus that communicates, via a network, with an apparatus in which is implemented an electronic device housing a diagnostic circuit, the program causing the computer to function as:
a test information storage section that stores in advance test information indicating test content to be performed by the diagnostic circuit;
a test information transmitting section that, when the test information is requested by the electronic device, transmits the test information to the electronic device;
a test information generating section that (i) receives a test result from the diagnostic circuit via the network, (ii) generates the test information indicating the test content to be performed next by the diagnostic circuit, based on the test result, and (iii) stores the test information in the test information storage section; and
an average decay calculating section that (i) receives, from a plurality of types of the electronic device, the test result of each electronic device and a total operational time of each electronic device and (ii) calculates an average decay of the plurality of types of electronic devices with respect to operational time, based on the total operational times and the test results.

* * * * *